United States Patent
Sun

(10) Patent No.: US 10,629,117 B2
(45) Date of Patent: Apr. 21, 2020

(54) DETECTION CIRCUIT, PIXEL ELECTRICAL SIGNAL COLLECTION CIRCUIT, DISPLAY PANEL AND DISPLAY APPARATUS

(71) Applicant: BOE TECHNOLOGY GROUP CO., LTD., Beijing (CN)

(72) Inventor: Tuo Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 405 days.

(21) Appl. No.: 15/113,770

(22) PCT Filed: Oct. 14, 2015

(86) PCT No.: PCT/CN2015/091920
§ 371 (c)(1),
(2) Date: Jul. 22, 2016

(87) PCT Pub. No.: WO2016/206234
PCT Pub. Date: Dec. 29, 2016

(65) Prior Publication Data
US 2017/0148380 A1 May 25, 2017

(30) Foreign Application Priority Data
Jun. 26, 2015 (CN) .......................... 2015 1 0369590

(51) Int. Cl.
*G09G 3/3225* (2016.01)
*G09G 3/3233* (2016.01)
(Continued)

(52) U.S. Cl.
CPC ......... *G09G 3/3225* (2013.01); *G09G 3/3233* (2013.01); *G09G 3/3266* (2013.01);
(Continued)

(58) Field of Classification Search
CPC ................... H01L 2251/5338; G09G 2380/02
See application file for complete search history.

(56) References Cited

U.S. PATENT DOCUMENTS

| 8,940,562 B1 | 1/2015 | Li | |
|---|---|---|---|
| 2007/0273620 A1* | 11/2007 | Yumoto | ............... G09G 3/3233 345/76 |

(Continued)

FOREIGN PATENT DOCUMENTS

| CN | 101295219 A | 10/2008 |
|---|---|---|
| CN | 103680412 A | 3/2014 |

(Continued)

OTHER PUBLICATIONS

International Search Report and Written Opinion (including English translation of Box V) dated Mar. 23, 2016, for corresponding PCT Application No. PCT/CN2015/091920.

*Primary Examiner* — Kent W Chang
*Assistant Examiner* — Chayce R Bibbee
(74) *Attorney, Agent, or Firm* — Kinney & Lange, P.A.

(57) ABSTRACT

The present disclosure relates to a detection circuit, a pixel electrical signal collection circuit, a display panel and a display apparatus, to solve the problem that the current technical solution of detecting whether a flexible display panel is deformed is relatively complex. The detection circuit of an AMOLED based flexible display panel comprises: a plurality of pixel electrical signal collection circuits, each configured to input an electrical signal of a pixel electrode of an organic light emitting diode thereof into an IC through a data collection line; and the IC configured to determine that the flexible display panel is deformed after the electrical signal varies. The embodiments of the present disclosure can detect whether a flexible display panel is deformed by collecting an electrical signal of a pixel electrode of an organic light emitting diode without arranging an (Continued)

individual film structure in the technical solution, thereby reducing the complexity of detecting whether a flexible screen is deformed.

13 Claims, 5 Drawing Sheets

(51) Int. Cl.
 G09G 3/3266 (2016.01)
 G09G 3/3275 (2016.01)
 H01L 27/32 (2006.01)
 H01L 51/00 (2006.01)
(52) U.S. Cl.
 CPC ....... G09G 3/3275 (2013.01); H01L 27/3265 (2013.01); H01L 27/3276 (2013.01); H01L 51/0097 (2013.01); G09G 2300/0819 (2013.01); G09G 2300/0842 (2013.01); G09G 2310/0286 (2013.01); G09G 2320/0295 (2013.01); G09G 2320/045 (2013.01); G09G 2380/02 (2013.01); H01L 2251/5338 (2013.01)

(56) References Cited

U.S. PATENT DOCUMENTS

| | | | |
|---|---|---|---|
| 2012/0038613 A1* | 2/2012 | Choi | G06F 1/1652 345/211 |
| 2014/0062976 A1* | 3/2014 | Park | G09G 5/00 345/204 |
| 2015/0091016 A1* | 4/2015 | Chen | G09G 3/3225 257/72 |
| 2015/0301636 A1* | 10/2015 | Akimoto | G06F 3/044 345/173 |

FOREIGN PATENT DOCUMENTS

| | | |
|---|---|---|
| CN | 104252817 A | 12/2014 |
| CN | 104933989 A | 9/2015 |

* cited by examiner

DETECTION CIRCUIT, PIXEL ELECTRICAL SIGNAL COLLECTION CIRCUIT, DISPLAY PANEL AND DISPLAY APPARATUS

CROSS-REFERENCE TO RELATED APPLICATION(S)

This application claims priority to the Chinese Patent Application No. 201510369590.X, filed on Jun. 26, 2015, entitled "DETECTION CIRCUIT, PIXEL ELECTRICAL SIGNAL COLLECTION CIRCUIT, DISPLAY PANEL AND DISPLAY APPARATUS" which is incorporated herein by reference in its entirety.

TECHNICAL FIELD

The present disclosure relates to the field of display technology, and in particular, to a detection circuit for an Active-Matrix Organic Light Emitting Diode (AMOLED) based flexible display panel, a pixel electrical signal collection circuit, a display panel and a display apparatus.

BACKGROUND

With the development of display technology, an increasing number of flexible display panels are put into the market. Compared with conventional display panels, flexible display panels are becoming more and more popular due to their advantages such as light and thin, foldable or even curlable, and good in mechanical properties.

Currently, applications in a device can be conveniently operated by deforming a flexible display panel. However, whether the flexible display panel is deformed is generally detected by using special macromolecular piezoelectric materials. In this technical solution, an individual film structure and a special circuit need to be arranged for coordination. This technical solution of detecting whether a flexible display panel is deformed is relatively complex.

In conclusion, the current technical solution of detecting whether a flexible display panel is deformed is relatively complex.

SUMMARY

The embodiments of the present disclosure provide a detection circuit of an AMOLED based flexible display panel, comprising:

an integrated circuit; and a plurality of pixel electrical signal collection circuits, each comprising an organic light emitting diode and a pixel capacitor, wherein an anode or cathode of the organic light emitting diode is a pixel electrode, wherein each of the plurality of pixel electrical signal collection circuits inputs an electrical signal of the pixel electrode thereof into the integrated circuit through a data collection line, and the electrical signal varies according to the pixel capacitor, and wherein the integrated circuit determines that the flexible display panel is deformed based on variation of the electrical signal.

The embodiments of the present disclosure can detect whether the flexible display panel is deformed by collecting the electrical signal of the pixel electrode of the organic light emitting diode without arranging an individual film structure in the technical solution, thereby reducing the complexity of detecting whether the flexible display panel is deformed.

Preferably, the pixel electrical signal collection circuit is further configured to:

when receiving a rising edge of a scanning signal, input the electrical signal into the integrated circuit through the data collection line, and when receiving a falling edge of the scanning signal, stop inputting the electrical signal into the integrated circuit through the data collection line; or when receiving the falling edge of the scanning signal, input the electrical signal into the integrated circuit through the data collection line, and when receiving the rising edge of the scanning signal, stop inputting the electrical signal into the integrated circuit through the data collection line.

Preferably, at least two of the pixel electrical signal collection circuits share a data collection line, and only one of the pixel electrical signal collection circuits which share a data collection line inputs an electrical signal into the integrated circuit through the data collection line at a time.

The two or more pixel electrical signal collection circuits can share a data collection line, thereby a number of data collection lines in the flexible display panel may be reduced.

Preferably, the integrated circuit is further configured to:

determine that the flexible display panel is deformed after determining that the electrical signal varies and a value of variation is less than a predetermined threshold.

It can be judged according to the predetermined threshold that the determined variation of the electrical signal is variation of the electrical signal due to deformation of the flexible display panel after determining that the electrical signal varies, thereby the accuracy of determining that the flexible display panel is deformed by determining the variation of the electrical signal may be improved.

Preferably, the integrated circuit is further configured to:

determine that the flexible display panel is not deformed if the value of variation is greater than or equal to the predetermined threshold.

When the value of variation is no less than the predetermined threshold, the variation of the electrical signal is variation of the electrical signal due to writing of pixel data, and therefore it can be determined that the flexible display panel is not deformed, thereby the accuracy of determining that the flexible display panel is deformed by determining the variation of the electrical signal may be further improved.

Preferably, the integrated circuit is further configured to:

convert the varied electrical signal into a signal which can be identified by the integrated circuit after determining that the flexible display panel is deformed; and determine deformation information of the flexible display panel according to the converted signal.

The deformation information of the flexible display panel can be determined according to the converted signal, so as to determine which type of deformation occurs in the flexible display panel, thereby functions of the flexible display panel may increase.

Preferably, the integrated circuit is further configured to:

determine an operation process corresponding to the deformation information of the flexible display panel according to a correspondence relationship between deformation information and operation processes after determining the deformation information of the flexible display panel.

The embodiments of the present disclosure provide a pixel electrical signal collection circuit, comprising:

a pixel circuit comprising an organic light emitting diode and a pixel capacitor, wherein an anode or cathode of the organic light emitting diode is a pixel electrode, and an output circuit, wherein the pixel circuit controls an electrical signal of the pixel electrode according to the pixel capacitor, and wherein the output circuit inputs the electrical signal into an integrated circuit through a data collection line, so that the integrated circuit determines that a flexible display panel is deformed after the electrical signal varies.

The embodiments of the present disclosure can collect the electrical signal of the pixel electrode of the organic light emitting diode in the pixel circuit, which achieves determination of whether the flexible display panel is deformed by determining variation of the electrical signal of the pixel electrode of the organic light emitting diode by adding the output circuit which outputs the electrical signal of the pixel electrode of the organic light emitting diode on the basis of the pixel circuit without arranging a special circuit, so as to simplify the technical solution of collecting the electrical signal, thereby the complexity of detecting whether the flexible display panel is deformed can be reduced.

Preferably, the output circuit is further configured to:

when receiving a rising edge of a scanning signal, input the electrical signal into the integrated circuit through the data collection line, and when receiving a falling edge of the scanning signal, stop inputting the electrical signal into the integrated circuit through the data collection line; or when receiving the falling edge of the scanning signal, input the electrical signal into the integrated circuit through the data collection line, and when receiving the rising edge of the scanning signal, stop inputting the electrical signal into the integrated circuit through the data collection line.

Preferably, the output circuit of the pixel electrical signal collection circuit shares a data collection line with an output circuit of at least one other pixel electrical collection circuit, and only one of the output circuits which share a data collection line inputs an output electrical signal into the integrated circuit through the data collection line at a time.

The two or more pixel electrical signal collection circuits can share a data collection line, thereby a number of data collection lines in the flexible display panel can be reduced.

The embodiments of the present disclosure further provide a display panel comprising the above circuit according to the embodiments of the present disclosure.

The embodiments of the present disclosure further provide a display apparatus comprising the above display panel according to the embodiments of the present disclosure.

DETAILED DESCRIPTION

A detection circuit of an AMOLED based flexible display panel according to the embodiments of the present disclosure comprises: an Integrated Circuit (IC) and a plurality of pixel electrical signal collection circuits, wherein each of the plurality of pixel electrical signal collection circuits is configured to input an electrical signal of a pixel electrode of an organic light emitting diode thereof into the IC through a data collection line, wherein the electrical signal of the pixel electrode of the organic light emitting diode is controlled by a pixel capacitor in the pixel electrical signal collection circuit, the pixel capacitor is used for indicating that the flexible display panel is deformed; and the IC is configured to determine that the flexible display panel is deformed after the electrical signal varies. The technical solution can detect whether a flexible display panel is deformed by collecting an electrical signal of a pixel electrode of an organic light emitting diode without arranging an individual film structure, thereby the complexity of detecting whether a flexible screen is deformed can be reduced.

The embodiments of the present disclosure will be further described in detail below in conjunction with description drawings.

Figure 1A:
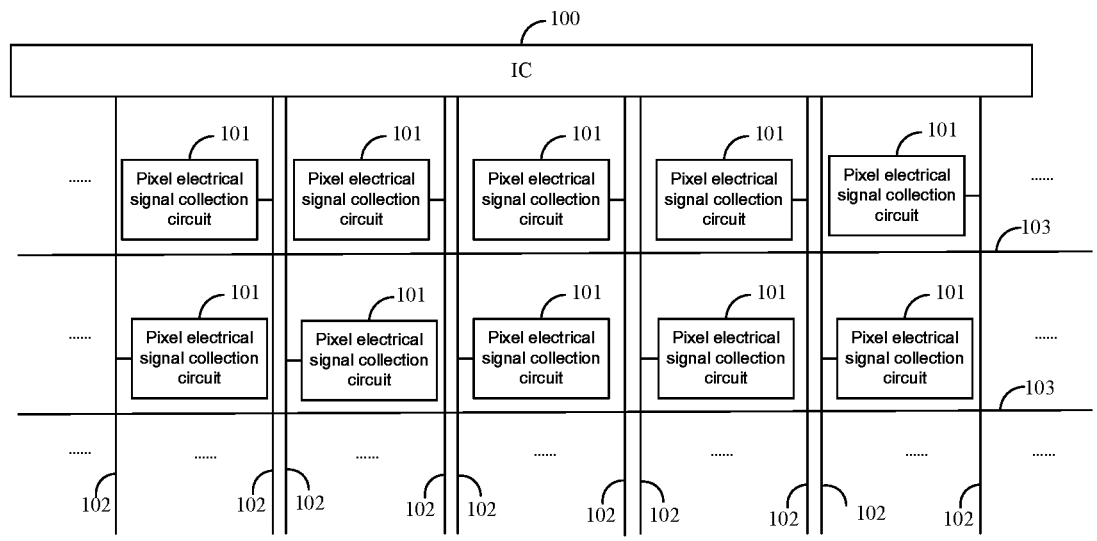
FIG. 1(a) is a diagram of a detection circuit of an AMOLED based flexible display panel according to a first embodiment of the present disclosure.

As shown in FIG. 1(a), a detection circuit of an AMOLED based flexible display panel according to a first embodiment of the present disclosure comprises:

an IC 100 and a plurality of pixel electrical signal collection circuits 101, wherein each of the plurality of pixel electrical signal collection circuits 101 is configured to input an electrical signal of a pixel electrode of an organic light emitting diode thereof into the IC 100 through a data collection line 102, wherein the electrical signal of the pixel electrode of the organic light emitting diode is controlled by a pixel capacitor in the pixel electrical signal collection circuit 101, the pixel capacitor is used for indicating that the flexible display panel is deformed, and the IC 100 is configured to determine that the flexible display panel is deformed after the electrical signal varies.

The pixel electrode may be an anode of the organic light emitting diode, or may also be a cathode of the organic light emitting diode. Specifically, for a forward AMOLED which currently is commonly used, the pixel electrode is the anode of the organic light emitting diode, and for a reverse AMOLED, the pixel electrode is the cathode of the organic light emitting diode.

Figure 2:
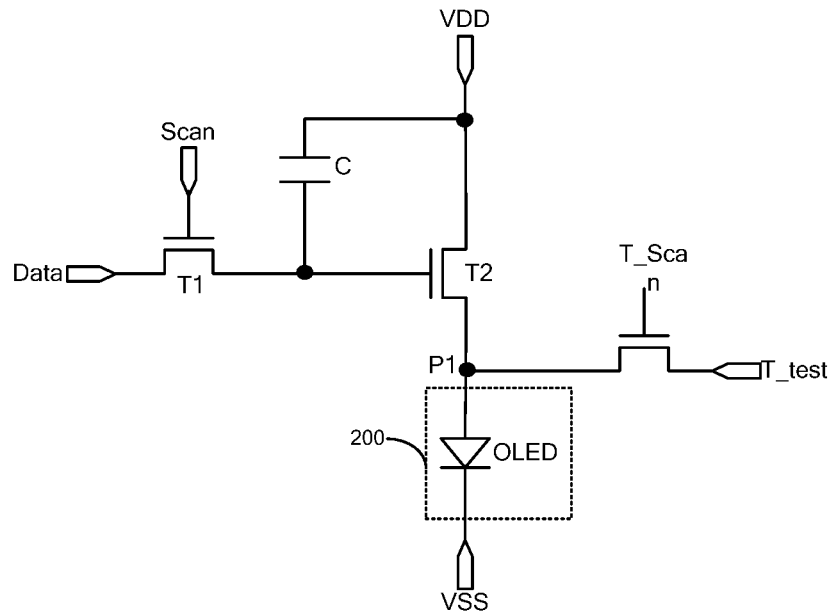
FIG. 2 is a diagram of a pixel electrical signal collection circuit according to a third embodiment of the present disclosure.

When the pixel electrode is the anode of the organic light emitting diode, a circuit diagram of the pixel electrical signal collection circuit 101 according to the embodiment of the present disclosure is shown in FIG. 2, and when the pixel electrode is the cathode of the organic light emitting diode, a connection manner is similar to that in FIG. 2, which will not be repeated here.

Further, it should be illustrated that the organic light emitting diode 200 may further be substituted with other elements, such as a resistor, which can directly reflect variation of the pixel capacitor through variation of the pixel electrode.

In the embodiment of the present disclosure, whether the flexible display panel is deformed can be determined by determining variation of the electrical signal of the pixel electrode of the organic light emitting diode, this is because, when the flexible display panel is deformed, the pixel capacitor varies, which directly results in the variation of the electrical signal of the pixel electrode of the organic light emitting diode. Therefore, it can be detected whether the flexible display panel is deformed by detecting the variation of the electrical signal of the pixel electrode of the organic light emitting diode. Compared with the method for directly detecting the variation of the pixel capacitor, the manner of detecting the electrical signal of the pixel electrode of the organic light emitting diode is simpler.

Specifically, a manner of inputting the electrical signal of the pixel electrode of the organic light emitting diode into the IC according to the embodiment of the present disclosure may be shown in FIG. 1(a), wherein various pixel electrical signal collection circuits correspond to different data collection lines. respectively.

Specifically, a process of collecting the electrical signal of the pixel electrode of the organic light emitting diode is as follows. When receiving a rising edge of a scanning signal, the pixel electrical signal collection circuit inputs the electrical signal of the pixel electrode of the organic light emitting diode thereof into the IC through a data collection line, and when receiving a falling edge of the scanning signal, stops inputting the electrical signal of the pixel electrode of the organic light emitting diode thereof into the IC through the data collection line; or when receiving the falling edge of the scanning signal, the pixel electrical signal collection circuit inputs the electrical signal of the pixel electrode of the organic light emitting diode thereof into the IC through the data collection line, and when receiving the rising edge of the scanning signal, stops inputting the electrical signal of the pixel electrode of the organic light emitting diode thereof into the IC through the data collection line.

A manner of inputting the electrical signal of the pixel electrode of the organic light emitting diode into the IC according to the embodiment of the present disclosure may also be shown in FIG. 1 (b), wherein at least two pixel electrical signal collection circuits share a data collection line. When at least two pixel electrical signal collection circuits share a data collection line, wiring of the flexible display panel is simplified.

A specific process of collecting the electrical signal of the pixel electrode of the organic light emitting diode is as follows. When receiving a rising edge of a scanning signal, the pixel electrical signal collection circuit inputs the electrical signal of the pixel electrode of the organic light emitting diode thereof into the IC through a data collection line, and when receiving a falling edge of the scanning signal, stops inputting the electrical signal of the pixel electrode of the organic light emitting diode thereof into the IC through the data collection line; or when receiving the falling edge of the scanning signal, the pixel electrical signal collection circuit inputs the electrical signal of the pixel electrode of the organic light emitting diode thereof into the IC through the data collection line, and when receiving the rising edge of the scanning signal, stops inputting the electrical signal of the pixel electrode of the organic light emitting diode thereof into the IC through the data collection line;

wherein only one of the pixel electrical signal collection circuits which share a data collection line inputs an electrical signal into the IC through the data collection line at a time.

It should be illustrated that the scanning signal according to the embodiments of the present disclosure is a signal output by a shift register, or may also be a signal provided by the IC, which is selected according to requirements in practical conditions. Reference number 103 in FIGS. 1(a) and 1(b) indicates a gate line, and the scanning signal according to the embodiments of the present disclosure may be input into the pixel electrical signal collection circuit through the gate line.

In the embodiments of the present disclosure, when receiving a rising edge of a scanning signal, the pixel electrical signal collection circuit inputs the electrical signal of the pixel electrode of the organic light emitting diode into the IC, and when receiving a falling edge of the scanning signal, stops inputting the electrical signal of the pixel electrode of the organic light emitting diode into the IC; or when receiving the falling edge of the scanning signal, the pixel electrical signal collection circuit inputs the electrical signal of the pixel electrode of the organic light emitting diode into the IC, and when receiving the rising edge of the scanning signal, stops inputting the electrical signal of the pixel electrode of the organic light emitting diode into the IC, wherein a period of time, from starting inputting the electrical signal of the pixel electrode of the organic light emitting diode into the IC to stopping inputting the electrical signal of the pixel electrode of the organic light emitting diode into the IC, is also referred to as active time for the scanning signal. That is, the IC according to the embodiments of the present disclosure collects the electrical signal of the pixel electrode of the organic light emitting diode during the active time for the scanning signal.

If the pixel electrical signal collection circuit inputs the electrical signal of the pixel electrode of the organic light emitting diode into the IC when receiving the rising edge of the scanning signal, and stops inputting the electrical signal of the pixel electrode of the organic light emitting diode into the IC when receiving the falling edge of the scanning signal, then high level time for the scanning signal is the active time; or if the pixel electrical signal collection circuit inputs the electrical signal of the pixel electrode of the organic light emitting diode into the IC when receiving the falling edge of the scanning signal, and stops inputting the electrical signal of the pixel electrode of the organic light emitting diode into the IC when receiving the rising edge of the scanning signal, then low level time for the scanning signal is the active time.

Figure 3A:
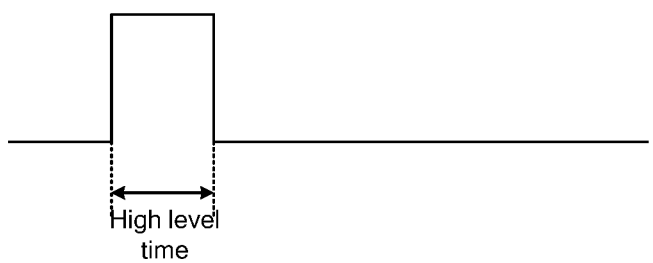
FIG. 3(a) is a diagram of a scanning signal according to a fourth embodiment of the present disclosure.
Figure 3B:
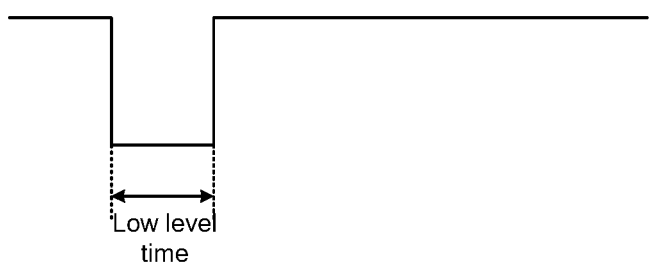
FIG. 3(b) is a diagram of a scanning signal according to a fifth embodiment of the present disclosure.

As shown in FIG. 3(a), illustrated is a diagram showing low level time as the active time according to the embodiment of the present disclosure; and as shown in FIG. 3(b), illustrated is a diagram showing high level time as the active time according to the embodiment of the present disclosure.

Figure 4:
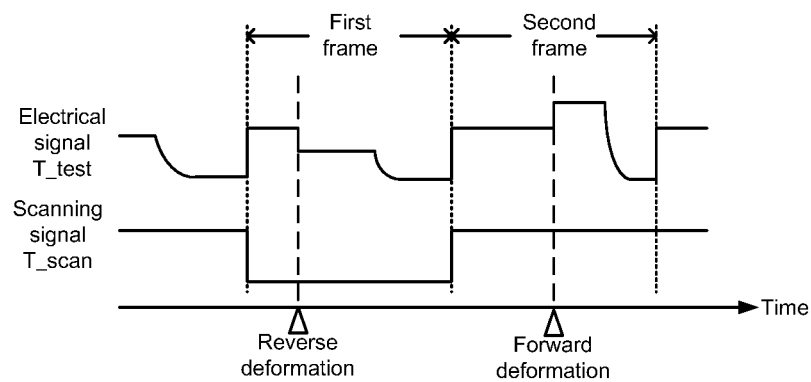
FIG. 4 is a diagram of an output electrical signal according to a sixth embodiment of the present disclosure.

As shown in FIG. 4, low level time for a scanning signal is active time, and therefore, the IC collects an electrical signal in the low level time for the scanning signal, i.e., first frame time, and does not collect the electrical signal in a second frame during which the scanning signal is at a high level.

After the IC completes collection of the electrical signal, a selectable manner of determining that the flexible display panel is deformed according to the embodiment of the present disclosure is as follows.

If it is determined that the electrical signal varies and a value of variation is less than a predetermined threshold, then it is determined that the flexible display panel is deformed; and if it is determined that the electrical signal varies and the value of variation is greater than or equal to the predetermined threshold, then it is determined that the flexible display panel is not deformed.

The threshold according to the embodiment of the present disclosure is predetermined according to requirements in practical conditions.

The reason for determining that the flexible display panel is not deformed when the IC determines that the electrical signal varies and the value of variation is greater than or equal to the predetermined threshold is as follows. When pixel data is being written, the electrical signal may decrease, and a value of variation of the electrical signal is much greater than a value of variation of the electrical signal due to deformation of the flexible display panel. Therefore, when the IC determines that the value of variation of the electrical signal is greater than or equal to the predetermined threshold, the IC can determines that the flexible display panel is not deformed.

After the IC determines that the flexible display panel is deformed, the embodiments of the present disclosure further provide a selectable manner of determining deformation information of the flexible display panel:

after determining that the flexible display panel is deformed, converting the varied electrical signal into a signal which can be identified by the IC; and determining deformation information of the flexible display panel according to the converted signal.

The deformation information of the flexible display panel according to the embodiments of the present disclosure is curliness, foldability or the like.

Specifically, the variation of the electrical signal is converted into a signal which can be identified by the IC. If as shown in FIG. 4, in the first frame, there is deformation in a reverse direction, and the variation of the electrical signal is decrease, the IC converts the variation of the electrical signal into an identifiable positive signal. If as shown in FIG. 4, in the second frame, there is deformation in a forward direction, and the variation of the electrical signal is increase, the IC converts the variation of the electrical signal into an identifiable negative signal. The deformation information is determined according to the converted signal. If an influence range of a converted signal is a straight line, then a number of folds may be determined according to a number of the straight lines, and a deformation direction may be determined according to whether each of the converted signals is positive or negative, thereby the deformation information of the flexible display panel may be determined. If the influence range of a converted signal is rather large instead of being only a straight line, the deformation direction may be determined according to whether each of the converted signals is positive or negative, thereby the deformation information of the flexible display panel may be determined.

Figure 5A:
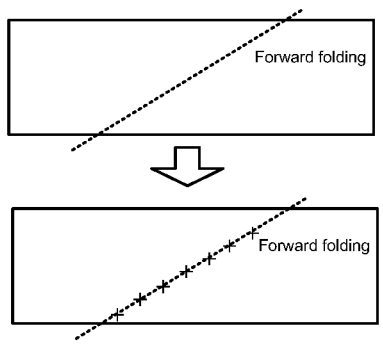
FIG. 5(a) is a diagram of variation of an electrical signal when a flexible display panel is folded in a single direction according to a seventh embodiment of the present disclosure.

In the embodiments of the present disclosure, positive corresponds to a forward deformation direction, and negative corresponds to a backward deformation direction. As shown in FIG. 5(a), illustrated is a diagram showing forward folding as the deformation information of the flexible display panel according to the embodiment of the present disclosure. A specific process of determining that the flexible display panel is folded in a forward direction is as follows.

The IC converts the variation of the electrical signal into an identifiable positive signal, and may determine that a range of the positive signal is a straight line according to the identifiable positive signal, thereby the deformation information of the flexible display panel may be determined as forward folding.

Figure 5B:
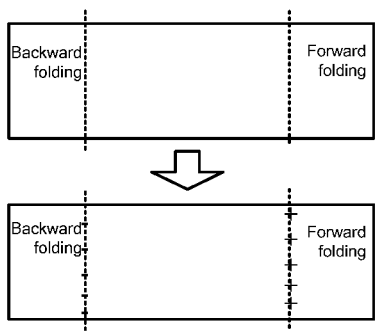
FIG. 5(b) is a diagram of variation of an electrical signal when a flexible display panel is folded in two directions according to an eighth embodiment of the present disclosure.

As shown in FIG. 5(b), illustrated is a diagram showing backward folding of a left half of the flexible display panel and forward folding of a right half of the flexible display panel according to the embodiment of the present disclosure. A specific process of determining that a left half of the flexible display panel is folded in a backward direction and a right half of the flexible display panel is folded in a forward direction is as follows.

The IC converts the variation of the electrical signal into an identifiable positive or negative signal, and determines that a range of the positive signal is a straight line in the right half of the flexible display panel according to the identifiable positive signal, and determines that a range of the negative signal is a straight line in the left half of the flexible display panel according to the identifiable negative signal, thereby the deformation information of the flexible display panel may be determined as backward folding of the left half of the flexible display panel and forward folding of the right half of the flexible display panel.

Figure 5C:
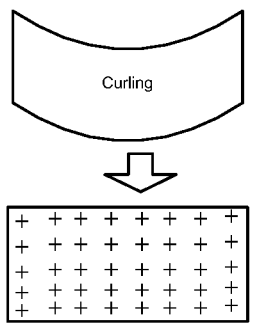
FIG. 5(c) is a diagram of variation of an electrical signal when a flexible display panel is curled in a single direction according to a ninth embodiment of the present disclosure.

As shown in FIG. 5(c), illustrated is a diagram showing forward curling as the deformation information of the flexible display panel according to the embodiment of the present disclosure. A specific process of determining forward curling as the deformation information of the flexible display panel is as follows.

The IC converts the variation of the electrical signal into a identifiable positive signal, and determines whether an influence range of the positive signal is the whole flexible display panel or only a part thereof according to the identifiable positive signal, that is, if the electrical signal of the flexible display panel varies in a large area, then the deformation information of the flexible display panel may be determined as forward curling.

Figure 5D:
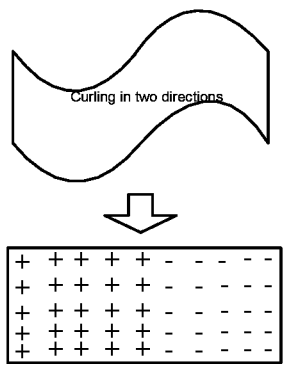
FIG. 5(d) is a diagram of variation of an electrical signal when a flexible display panel is curled in two directions according to a tenth embodiment of the present disclosure.

As shown in FIG. 5(d), illustrated is a diagram showing forward curling of a left half of the flexible display panel and backward curling of a right half of the flexible display panel as the deformation information of the flexible display panel according to the embodiment of the present disclosure. A specific process of determining forward curling as the deformation information of the flexible display panel is similar to the specific process in FIG. 5(c) of determining the deformation information of the flexible display panel as forward curling, which will not be repeated here.

Further, in the embodiments of the present disclosure, after determining the deformation information of the flexible display panel, an operation process corresponding to the deformation information of the flexible display panel is determined according to a correspondence relationship between deformation information and operation processes.

The operation processes comprise but are not limited to video fast forwarding, webpage refreshing, text switching, document opening or the like.

For example, an operation process corresponding to forward curling in a single direction is video fast forwarding. After the IC determines that the deformation information of the flexible display panel is forward curling in a single direction, the IC determines that the corresponding operation process is video fast forwarding.

Figure 6:
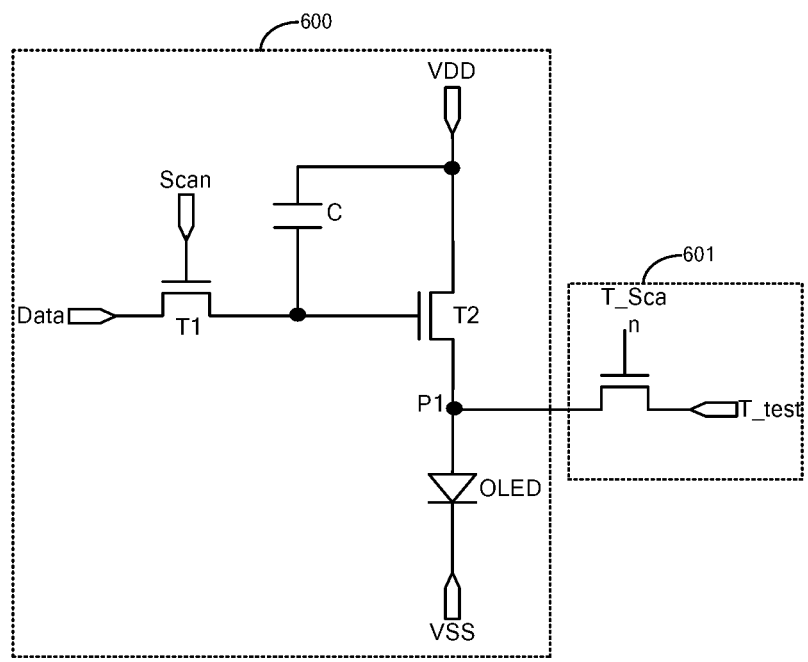
FIG. 6 is a diagram of a pixel electrical signal collection circuit according to an eleventh embodiment of the present disclosure.

The pixel electrical signal collection circuit according to the embodiments of the present disclosure may be one circuit, or may comprise a pixel circuit 600 and an output circuit 601 as shown in FIG. 6.

The pixel circuit 600 is configured to control an output electrical signal of a pixel electrode of an organic light emitting diode according to a pixel capacitor thereof, and the output circuit 601 is configured to input the electrical signal of the pixel electrode of the organic light emitting diode into the IC through a data collection line so that the IC determines that the flexible display panel is deformed after the electrical signal varies.

The pixel electrode may be an anode of the organic light emitting diode, or may also be a cathode of the organic light emitting diode. Specifically, for a forward AMOLED which currently is commonly used, the pixel electrode is the anode of the organic light emitting diode, and for a reverse AMOLED, the pixel electrode is the cathode of the organic light emitting diode. When the pixel electrode is the anode of the organic light emitting diode, a circuit diagram of the pixel current 600 and the output circuit 601 according to the embodiments of the present disclosure is shown in FIG. 6, and when the pixel electrode is the cathode of the organic light emitting diode, a connection manner is similar to that in FIG. 6, which will not be repeated here.

It should be illustrated that a connection form of the pixel circuit 600 is not limited to that in the embodiments of the present disclosure, and the output circuit 601 only needs to be connected to a pixel electrode end P1 of the organic light emitting diode in the pixel circuit 600.

A manner of outputting, by the output circuit 601, the electrical signal of the pixel electrode of the organic light emitting diode according to the embodiments of the present disclosure may be shown in FIG. 1(a), wherein output circuits 601 of various pixel electrical signal collection circuits correspond to different data collection lines respectively.

A specific process of collecting the electrical signal of the pixel electrode of the organic light emitting diode is as follows. When receiving a rising edge of a scanning signal, the output circuit 601 inputs the electrical signal of the pixel electrode of the organic light emitting diode in the pixel circuit into the IC through a data collection line, and when receiving a falling edge of the scanning signal, stops inputting the electrical signal of the pixel electrode of the organic light emitting diode in the pixel circuit into the IC through the data collection line; or when receiving the falling edge of the scanning signal, the output circuit 601 inputs the electrical signal of the pixel electrode of the organic light emitting diode in the pixel circuit into the IC through the data collection line, and when receiving the rising edge of the scanning signal, stops inputting the electrical signal of the pixel electrode of the organic light emitting diode in the pixel circuit into the IC through the data collection line.

Figure 1B:
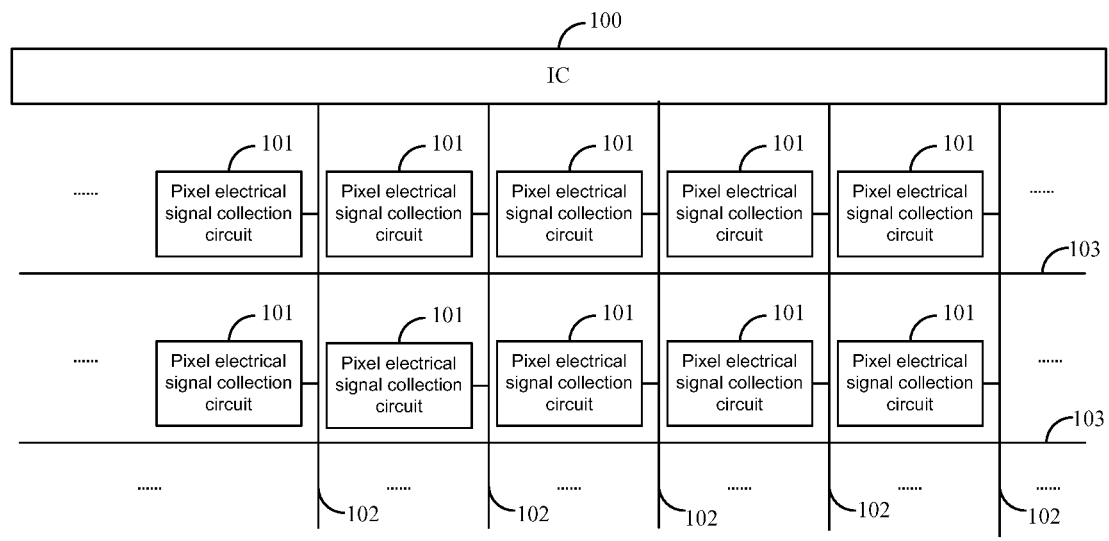
FIG. 1(b) is a diagram of a detection circuit of an AMOLED based flexible display panel according to a second embodiment of the present disclosure.

A manner of inputting the electrical signal of the pixel electrode of the organic light emitting diode into the IC according to the embodiments of the present disclosure may also be shown in FIG. 1(b), wherein the output circuit 601 of the pixel electrical signal collection circuit and an output circuit of at least one other pixel electrical collection circuit share a data collection line.

A specific process of collecting the electrical signal of the pixel electrode of the organic light emitting diode is as follows. When receiving a rising edge of a scanning signal, the output circuit 601 inputs the electrical signal of the pixel electrode of the organic light emitting diode in the pixel circuit into the IC through a data collection line, and when receiving a falling edge of the scanning signal, stops inputting the electrical signal of the pixel electrode of the organic light emitting diode in the pixel circuit into the IC through the data collection line; or when receiving the falling edge of the scanning signal, the output circuit 601 inputs the electrical signal of the pixel electrode of the organic light emitting diode in the pixel circuit into the IC through the data collection line, and when receiving the rising edge of the scanning signal, stops inputting the electrical signal of the pixel electrode of the organic light emitting diode in the pixel circuit into the IC through the data collection line, wherein only one of the output circuits inputs an output electrical signal into the IC through the data collection line at a time.

It should be illustrated that the scanning signal according to the embodiments of the present disclosure is a signal output by a shift register, or may also be a signal provided by the IC, which is selected according to requirements in practical conditions. Reference number 103 in FIGS. 1(a) and 1(b) indicates a gate line, and the scanning signal according to the embodiments of the present disclosure may be input into the output circuit of the pixel electrical signal collection circuit through the gate line.

In the embodiments of the present disclosure, when receiving a rising edge of a scanning signal, the output circuit of the pixel electrical signal collection circuit inputs the electrical signal of the pixel electrode of the organic light emitting diode into the IC, and when receiving a falling edge of the scanning signal, stops inputting the electrical signal of the pixel electrode of the organic light emitting diode into the IC; or when receiving the falling edge of the scanning signal, the output circuit of the pixel electrical signal collection circuit inputs the electrical signal of the pixel electrode of the organic light emitting diode into the IC, and when receiving the rising edge of the scanning signal, stops inputting the electrical signal of the pixel electrode of the organic light emitting diode into the IC, wherein a period of time, from starting inputting the electrical signal of the pixel electrode of the organic light emitting diode into the IC to stopping inputting the electrical signal of the pixel electrode of the organic light emitting diode into the IC, is also referred to as active time for the scanning signal. That is, the IC according to the embodiments of the present disclosure collects the electrical signal of the pixel electrode of the organic light emitting diode during the active time for the scanning signal.

If the output circuit of the pixel electrical signal collection circuit inputs the electrical signal of the pixel electrode of the organic light emitting diode into the IC when receiving the rising edge of the scanning signal, and stops inputting the electrical signal of the pixel electrode of the organic light emitting diode into the IC when receiving the falling edge of the scanning signal, then high level time for the scanning signal is the active time; or if the output circuit of the pixel electrical signal collection circuit inputs the electrical signal of the pixel electrode of the organic light emitting diode into the IC when receiving the falling edge of the scanning signal, and stops inputting the electrical signal of the pixel electrode of the organic light emitting diode into the IC when receiving the rising edge of the scanning signal, then low level time for the scanning signal is the active time.

Figure 7:
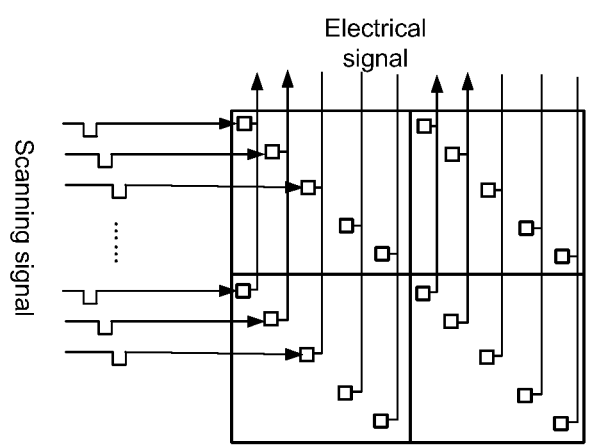
FIG. 7 is a diagram of a principle of collecting an electrical signal according to a twelfth embodiment of the present disclosure.

A condition that only one of the output circuits inputs the output electrical signal into the IC through the data collection line at a time will be described by taking FIG. 7 as an example.

Generally, for a full high definition screen with a frame frequency of 60 Hz, the flexible display panel may be divided into blocks in accordance with 32*60 sub-pixels, and if a refresh rate (a frame frequency of the scanning signal) is increased to 120 Hz, the flexible display panel may be divided into 120 blocks in a longitudinal direction. Sub-pixels in a diagonal direction within each divided block are shown in FIG. 7. When the output circuit of the flexible display panel operates, the scanning signal is in active time of 1 frame in an $n^{th}$ row of an $n^{th}$ block. At this time, the collected pixel electrical signals have no conflict during output, and a next frame of active time of all scanning signals is shifted to a next row to collect another part of pixel electrical signals. In this way, all test points are scanned within 1 second.

Based on the same inventive concept, the embodiments of the present disclosure provide a display panel comprising the above circuit according to the embodiments of the present disclosure. As the principle of solving the problem by the display panel is the same as that of the above circuit, the implementation of the display panel may be known with reference to that of the above circuit, and repeated parts will be omitted here.

Based on the same inventive concept, the embodiments of the present disclosure provide a display apparatus, including the above display panel according to the embodiments of the present disclosure. The display apparatus may be any product or component with a display function such as a mobile phone, a tablet, a television, a display, a notebook, a digital photo frame, a navigator etc. As the principle of solving the problem by the display apparatus is the same as that of the display panel, the implementation of the display apparatus may be known with reference to that of the display panel, and repeated parts will be omitted here.

It can be known from the above content that the detection circuit of an AMOLED based flexible display panel according to the embodiments of the present disclosure comprises: an IC and a plurality of pixel electrical signal collection circuits, wherein each of the plurality of pixel electrical signal collection circuits is configured to input an electrical signal of a pixel electrode of an organic light emitting diode thereof into the IC through a data collection line, wherein the electrical signal of the pixel electrode of the organic light emitting diode is controlled by a pixel capacitor in the pixel electrical signal collection circuit, the pixel capacitor is used for indicating that the flexible display panel is deformed; and the IC is configured to determine that the flexible display panel is deformed after the electrical signal varies. The technical solution can detect whether a flexible display panel is deformed by collecting an electrical signal of a pixel electrode of an organic light emitting diode without arranging an individual film structure, thereby reducing the complexity of detecting whether a flexible screen is deformed.

Obviously, various modifications and variants can be made to the present disclosure by those skilled in the art without departing from the spirit and scope of the present disclosure. Therefore, these modifications and variants are to be encompassed by the present disclosure if they fall within the scope of the present disclosure as defined by the claims and their equivalents.

I claim:

1. A detection circuit of an Active-Matrix Organic Light Emitting Diode (AMOLED) based flexible display panel, comprising:
   an integrated circuit; and
   a plurality of pixel electrical signal collection circuits, each pixel electrical signal collection circuit comprising a pixel circuit and an output circuit, the pixel circuit comprising an organic light emitting diode, a driving transistor and a pixel capacitor, wherein an anode or cathode of the organic light emitting diode is electrically connected to an electrode of the driving transistor,
   wherein the output circuit is electrically connected to the electrode of the driving transistor and is configured to transfer an electrical signal input at the electrode of the driving transistor to the integrated circuit through a data collection line, and the electrical signal varies according to the pixel capacitor, and
   wherein the integrated circuit determines that the flexible display panel is deformed based on variation of the electrical signal.

2. The detection circuit according to claim 1, wherein the pixel electrical signal collection circuit is configured to:
   upon receiving a rising edge of a scanning signal, input the electrical signal into the integrated circuit through the data collection line, and upon receiving a falling edge of the scanning signal, stop inputting the electrical signal into the integrated circuit through the data collection line; or
   upon receiving the falling edge of the scanning signal, input the electrical signal into the integrated circuit through the data collection line, and upon receiving the rising edge of the scanning signal, stop inputting the electrical signal into the integrated circuit through the data collection line.

3. The detection circuit according to claim 2, wherein at least two of the pixel electrical signal collection circuits share a data collection line, and only one of the pixel electrical signal collection circuits which share a data collection line inputs an electrical signal into the integrated circuit through the data collection line at a time.

4. The detection circuit according to claim 1, wherein the integrated circuit is configured to:
   determine that the flexible display panel is deformed after determining that the electrical signal varies and a value of variation is less than a predetermined threshold.

5. The detection circuit according to claim 4, wherein the integrated circuit is further configured to:
   determine that the flexible display panel is not deformed if the value of variation is greater than or equal to the predetermined threshold.

6. The detection circuit according to claim 1, wherein the integrated circuit is further configured to:
   convert the varied electrical signal into a signal which can be identified by the integrated circuit after determining that the flexible display panel is deformed; and
   determine deformation information of the flexible display panel according to the converted signal.

7. The detection circuit according to claim 6, wherein the integrated circuit is further configured to:
   determine an operation process corresponding to the deformation information of the flexible display panel according to a correspondence relationship between deformation information and operation processes after determining the deformation information of the flexible display panel.

8. A pixel electrical signal collection circuit, comprising:
   a pixel circuit comprising an organic light emitting diode, a driving transistor and a pixel capacitor, wherein an anode or cathode of the organic light emitting diode is electrically connected to an electrode of the driving transistor, and
   an output circuit, wherein the output circuit is electrically connected to the electrode of the driving transistor and is configured to transfer an electrical signal input at the electrode of the driving transistor to an integrated circuit through a data collection line, so that the integrated circuit determines that a flexible display panel is deformed based on variation of the electrical signal.

9. The circuit according to claim 8, wherein the output circuit is configured to:
  upon receiving a rising edge of a scanning signal, input the electrical signal into the integrated circuit through the data collection line, and upon receiving a falling edge of the scanning signal, stop inputting the electrical signal into the integrated circuit through the data collection line; or
  upon receiving the falling edge of the scanning signal, input the electrical signal into the integrated circuit through the data collection line, and upon receiving the rising edge of the scanning signal, stop inputting the electrical signal into the integrated circuit through the data collection line.

10. The circuit according to claim 9, wherein the output circuit of the pixel electrical signal collection circuit shares a data collection line with an output circuit of at least one other pixel electrical collection circuit, and only one of the output circuits which share a data collection line inputs an output electrical signal into the integrated circuit through the data collection line at a time.

11. A display panel comprising the detection circuit according to claim 1.

12. A display apparatus comprising the display panel according to claim 11.

13. A detection circuit of an Active-Matrix Organic Light Emitting Diode (AMOLED) based flexible display panel, the detection circuit comprising:
  an integrated circuit; and
  a plurality of pixel electrical signal collection circuits, each pixel electrical signal collection circuit comprising a pixel circuit and an output circuit, the pixel circuit comprising an organic light emitting diode, a driving transistor and a pixel capacitor, wherein an anode or cathode of the organic light emitting diode is electrically connected to an electrode of the driving transistor,
  wherein the output circuit is electrically connected to the electrode of the driving transistor and is configured to transfer an electrical signal input at the electrode of the driving transistor to the integrated circuit through a data collection line, and the electrical signal varies according to the pixel capacitor, and
  wherein the integrated circuit determines that the flexible display panel is deformed based on variation of the electrical signal,
  wherein the integrated circuit is further configured to:
    convert the varied electrical signal into a signal which can be identified by the integrated circuit after determining that the flexible display panel is deformed; and
    determine deformation information of the flexible display panel according to the converted signal, and
    wherein the deformation information comprises a forward deformation direction and a backward deformation direction, the deformation information is determined as the forward deformation direction if the variation of the electrical signal is a decrease, and the deformation information is determined as the backward deformation direction if the variation of the electrical signal is an increase.

* * * * *